United States Patent [19]
Yamagishi et al.

[11] Patent Number: 5,264,710
[45] Date of Patent: Nov. 23, 1993

[54] AMORPHOUS SEMICONDUCTOR, AMORPHOUS SEMICONDUCTOR DEVICE USING HYDROGEN RADICALS

[75] Inventors: Hideo Yamagishi, Kobe; Akihiko Hiroe, Fujisawa; Hitoshi Nishio, Kobe; Keiko Miki, Kobe; Kazunori Tsuge, Kobe; Yoshihisa Tawada, Kobe, all of Japan

[73] Assignee: Kanegafuchi Kagaku Kogyo Kabushiki Kaisha, Osaka, Japan

[21] Appl. No.: 864,944

[22] Filed: Apr. 7, 1992

Related U.S. Application Data

[63] Continuation of Ser. No. 665,935, Mar. 5, 1991, abandoned, which is a continuation of Ser. No. 326,831, Mar. 21, 1989, abandoned.

[51] Int. Cl.$^5$ .............................................. H01L 45/00
[52] U.S. Cl. ........................................... 257/2; 257/52; 257/53; 257/59; 257/55; 437/101; 136/258
[58] Field of Search .............. 437/3, 5, 101; 136/261, 136/255, 258 AM; 257/55, 56, 59, 458, 472, 473, 449, 453, 52, 53, 54, 2

[56] References Cited

U.S. PATENT DOCUMENTS

| | | | |
|---|---|---|---|
| 4,491,626 | 1/1985 | Kawamura et al. | 357/2 X |
| 4,532,199 | 7/1985 | Ueno et al. | 136/258 AM X |
| 4,615,905 | 10/1986 | Ovshinsky et al. | 437/173 X |
| 4,839,240 | 6/1989 | Shimizu et al. | 357/2 X |
| 4,885,614 | 12/1989 | Furukawa et al. | 357/16 |
| 4,954,182 | 9/1990 | Ovshinsky et al. | 357/30 X |
| 5,007,971 | 4/1991 | Kanai et a. | 357/30 X |

FOREIGN PATENT DOCUMENTS 63-66434 12/1988 Japan .

OTHER PUBLICATIONS

Yamanaka et al., "High-Performance Hydrogenated Amorphous Silicon-Germanium Solar Cells Fabricated by Photochemical Vapor Deposition," *Japanese Jour. of Appl. Phys.*, vol. 26, No. 7, Jul. 1987, pp. 1107-1111.

Watanabe et al., "Chemical Vapor Deposition of a-Si-Ge:H Films Utilizing A Microwave-Excited Plasma," *Japanese Jour. of Applied Physics*, vol. 26, No. 4, Apr. 1987, pp. 1288-1290.

Mackenzie et al., "Structural, Electrical, and Optical Properties of a-Si$_{1-x}$Ge$_x$:H and An Inferred Electronic Band Structure," *Physical Review B*, vol. 31, No. 4, Feb. 15, 1985, pp. 2198-2212.

Christou et al., "Schottky Barrier Formation on Electron Beam Deposited Amorphous Si$_{1-x}$GE$_x$:H Alloys and Amorphous (Si/Si$_{1-x}$GE$_x$): H Modulated Structures," *Appl. Phys. Lett.*, 48(6), Feb. 10, 1986, pp. 408-410.

*Primary Examiner*—William Mintel
*Attorney, Agent, or Firm*—Armstrong, Westerman, Hattori, McLeland & Naughton

[57] ABSTRACT

Amorphous semiconductor thin film is exposed to an atmosphere of hydrogen radical during or after the formation of thin film, or is subject to light irradiation having a density of not less than 10 W/cm$^2$ at a wavelength of 300 to 700 nm during the formation of the thin film. The obtained thin film has improved, i.e. small, photo deterioration. The semiconductor device using the above thin film is preferably applied to solar cells or thin film transistors.

11 Claims, 2 Drawing Sheets

AMORPHOUS SEMICONDUCTOR, AMORPHOUS SEMICONDUCTOR DEVICE USING HYDROGEN RADICALS

This is a continuation of Ser. No. 665,935, filed Mar. 5, 1991, which is a continuation of Ser. No. 326,831, filed Mar. 21, 1989, both now abandoned.

BACKGROUND OF THE INVENTION

The present invention relates to an amorphous semiconductor, an amorphous semiconductor device and a method of producing the same, and more particularly to an amorphous semiconductor, an amorphous semiconductor device and a method of producing the same in which the deterioration of electric characteristic of amorphous semiconductor is improved (lessened).

Recently tetrahedral amorphous semiconductors such as amorphous silicon obtained by the plasma CVD method and the like have been expected to be applied to solar cells, thin film transistors, large-sized sensors and the like, since tetrahedral amorphous semiconductors enable the production of semiconductor having a large area and reduction in costs. However, when the above-mentioned semiconductors are used for photoelectric conversion, stability thereof to light becomes an important problem. The photo deterioration of amorphous silicon was discovered by Dr. Steabler and Dr. Wronski in 1977. The change in electric characteristic due to light, particularly strong light, is a serious obstacle to the application of amorphous semiconductor to solar cells or electrophotographic photosensitive drum.

The present invention was made to solve the above mentioned problem, and it is an object of the present invention to provide a method of producing amorphous semiconductor capable of improving deterioration of electric characteristic due to light and improving light resistance.

SUMMARY OF THE INVENTION

In accordance with the present invention, there is provided a method of producing amorphous semiconductor comprising forming on a substrate a thin film of amorhous silicon semiconductor (1) by the decomposition of silane family gas or mixed gas of silane family gases by at least one of plasma, heat and light or (2) by the sputtering or reactive sputtering using silicon or silicone compound as a target, characterized in that (A) the deposition of thin film is interrupted for a moment on the way, the deposited thin film is exposed to an atmosphere of hydrogen radical and then the deposition of thin film is resumed, or (B) after the thin film of amorphous semiconductor is formed the thin film is exposed to an atmosphere of hydrogen radical.

When the thickness of the thin film is large, the exposure to an atmosphere of hydrogen radical and deposition of thin film can be carried out alternately so as to enable hydrogen to diffuse into the whole film.

The present invention further provides a method of producing amorphous semiconductor comprising forming on a substrate a thin film of amorphous silicon semiconductor (1) by the decomposition of silane family gas or mixed gases of the silane family gas by at least one of plasma, heat and light or (2) by the sputtering or reactive sputtering using silicon or silicone compound as a target, characterized in that the deposition of thin film is carried out while irradiating continuous light or pulse light having an intensity of not less than 10 w/cm² at a wavelength of 300 to 700 nm.

DETAILED DESCRIPTION

Figure 1:
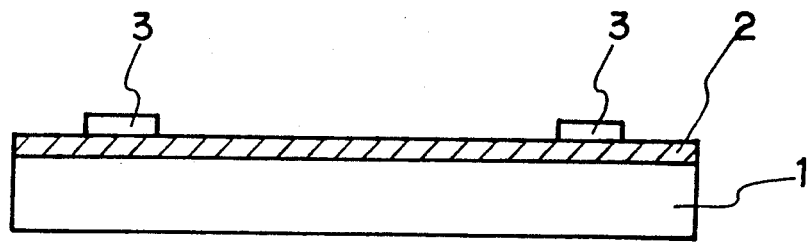
FIG. 1 is a schematic sectional view of a sample in Example 1 of the present invention.

Both a first aspect and a second aspect of the present invention relate to improvement of method for producing amorphous semiconductor thin film. The feature of the first aspect of the present invention resides in exposing an amorphous semiconductor thin film to an atmosphere of hydrogen radical during or after the formation of thin film, whereby improving or lessening photo deterioration of the obtained thin film. On the other hand, the feature of the second aspect of the present invention resides in irradiating light, which is sufficient to photo-deteriorate a thin film, to the thin film during the formation thereof, whereby also improving or lessening photo deterioration of the obtained thin film.

A thin film of amorphous silicon semiconductor is obtained by depositing amorphous silicon semiconductor on a substrate by the decomposition of silane family gas or mixed gas of silane family gases by at least one of plasma, heat and light. The thin film is also obtained by the sputtering using silicon or silicone compound as a target, or by the reactive sputtering further introducing a gas containing composing elements of the objects or an impurity gas.

Firstly the first aspect of the present invention is explained hereinafter.

In the first aspect of the present invention, an amorphous semiconductor thin film is exposed to an atmosphere of hydrogen radical during or after the formation of thin film. By the exposure to an atmosphere of hydrogen radical, bonding nature of atoms in the film, especially coordination or amount of hydrogen in the film, is changed so that stability of the thin film to light irradiation is increased.

Hydrogen radical can be generated by the glow-discharging or ECR-microwave-plasma discharging of hydrogen gas or mixed gas of hydrogen gas and inert gas, or by other suitable method.

Though the temperature of a substrate when a thin film is exposed to hydrogen radical might be around room temperature, photo deterioration of the film can be effectively prevented when the temperature of the substrate is kept high, i.e. around 100° C. It is not preferable that the temperature of the substrate during exposure to hydrogen radical greatly exceed a temperature of the substrate during the formation of thin film, since there is a danger that the film property deteriorates.

Though the exposure time in an atmosphere of hydrogen radical might be short to a degree of several minutes, photo deterioration can be remarkably effectively prevented when the film is exposed to hydrogen radical more than one or two hours.

Next, the second aspect of the present invention is exlained.

In the second aspect of the present invention, light is irradiated to a thin film during the formation thereof so that stability of semiconductor thin film to light is increased.

Though the detailed reason as to why photo deterioration of semiconductor thin film can be reduced is not necessarily clear, it is presumed that the stability of thin film to light is increased due to change of bonding nature of a part of atoms in the thin film. The change in electric characteristic of amorphous semiconductor due to light irradiation, named "Steabler-Wronski effect", is considered to take place by the change in bonding nature of a part of atoms constructing semiconductor due to capture or recombination of light itself or carrier generated by light. Accordingly, in the method according to the second aspect of the present invention, bonding nature of a part of atoms which is subject to photo deterioration is changed, during the formation of thin film, to a bonding nature after photo deterioration. The formation of thin film is further carried out, and a semiconductor thin film having bonding nature different from that of conventional thin film is formed. Photo deterioration given to the film beforehand can be recovered by the annealing process at a temperature of not less than 150° C. So, electric characteristic of the obtained thin film is not lowered so much at an usual film-forming temperature if the light irradiation is conducted.

Photo deterioration during the film formation can be carried out by the irradiation of continuous light or pulse light having an intensity of not less than 10 w/cm$^2$ at a wavelength of 300 to 700 nm.

In the present invention, a-Si$_{1-x-y}$Ge$_x$C$_y$ : H, a-Si$_{1-x-y}$Ge$_x$C$_y$ : H : F (wherein x and y satisfy the relationship of $0 \leq X$, $y \leq 1$) and the like can be used as amorphous semiconductor. The amorphous semiconductor produced by the above-mentioned method of the present invention can be preferably applied to semiconductor devices having a pin structure or Schottky structure.

Next, the method of the present invention is explained based on Examples. However, a scope of the present invention is not limited thereto.

EXAMPLES 1 and 2

Amorphous silicon film 2 of about 1 μm in thickness was deposited on a substrate 1 (#7059: Commercial name, made by Corning Glass Works) by the charge coupled parallel flat plate electrode (RS) glow discharge decomposition method under the following conditions.

Density of discharge power : about 10 mW/cm$^2$
Flow of silane gas : 50 SCCM
Discharge pressure : 3 Torr
Substrate temperature : 200° C.

Coplanar-shaped Al electrodes 3 were formed on the amorphous silicon film 2 to produce samples as shown in FIG. 1.

Samples were then subjected to hydrogen plasma treatment for about 4 hours in an RS glow discharge apparatus at a discharge power density of about 70 mW/cm$^2$, at a hydrogen pressure of 1 Torr, and at a substrate temperature of room temperature (Example 1) or 100° C. (Example 2).

Figure 2:
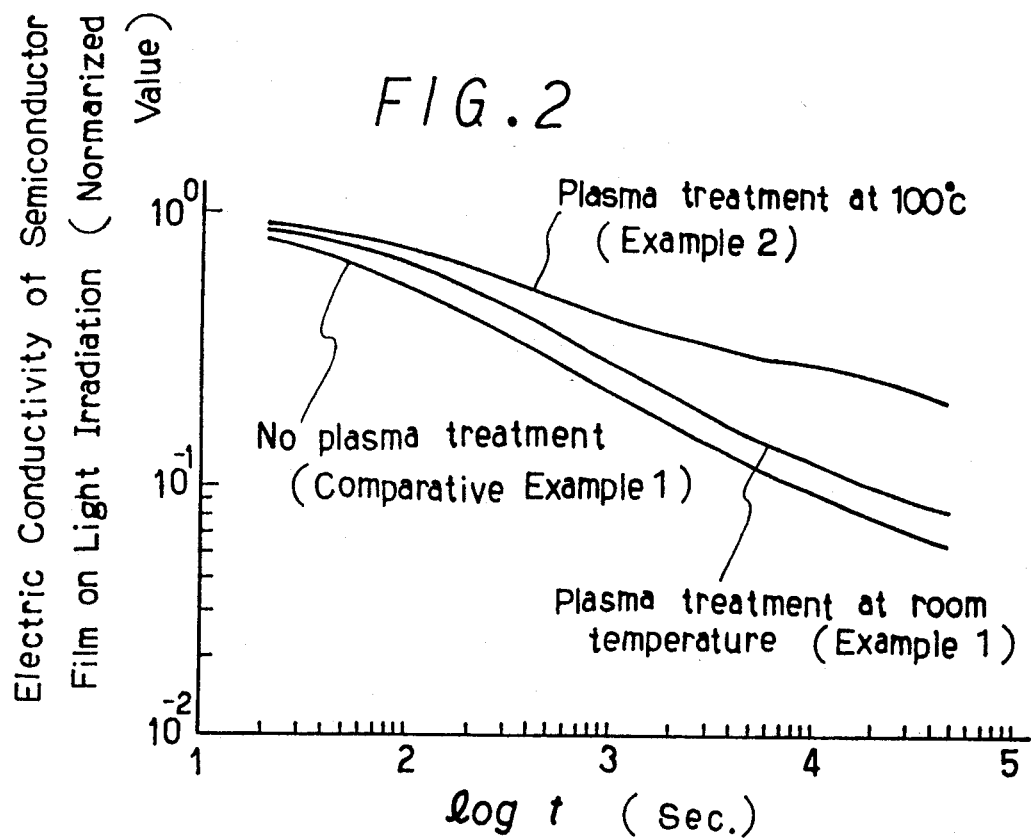
FIG. 2 is a graph showing the difference in photo deterioration between a sample exposed to an atmosphere of hydrogen radical after the formation of thin film and a sample not exposed to an atmosphere of hydrogen radical.

Photo current in each sample were measured under AM-1 simulated sun light having an intensity of 100 mW/cm$^2$ and photo deterioration of the samples was examined. The results are shown in FIG. 2.

EXAMPLE 3

Amorphous silicon film 12 of about 1 μm in thickness was deposited on a substrate 11 (#7059) by the RS glow discharge decomposition method under the following conditions.

Density of discharge power : about 10 mW/cm$^2$
Flow of silane gas : 50 SCCM
Discharge pressure : 0.3 Torr
Substrate temperature : 200° C.

Figure 3:
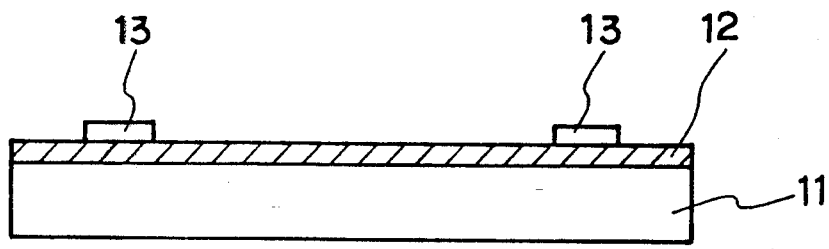
FIG. 3 is a schematic sectional view of a sample in Example 3 of the present invention.

During the deposition of amorphous silicon film 12, stroboscopic light was irradiated at an interval of five seconds through a quartz window from a direction oblique to the substrate 11. The average illuminance on the substrate was about 103 W/cm$^2$, and the term for one pulse was 1 ms. The amount of deterioration caused by a pulse having the above intensity corresponds to that caused by continuous irradiation of solar simulator (AM-1) having an intensity of 100 mW/cm$^2$ for 30 minutes. Coplanar-shaped Al electrodes 13 were formed on the obtained undoped amorphous silicon film 12 to produce samples as shown in FIG. 3.

Figure 4:
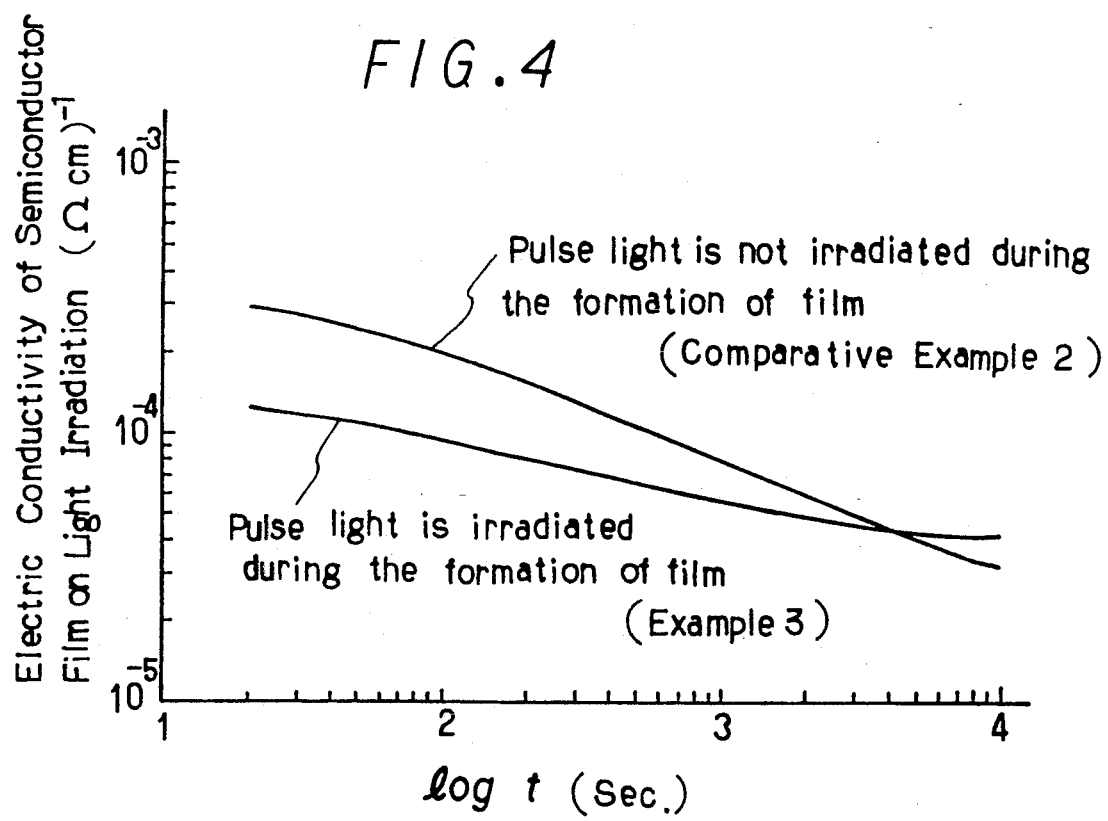
FIG. 4 is a graph showing the difference in photo deterioration between a sample exposed to light irradiation during the formation of thin film and a sample not exposed to light irradiation.

Photo current in each sample were measured under AM-1 simulated sun light having an intensity of 100 mW/cm$^2$ and photo deterioration of the samples was examined. The results are shown in FIG. 4.

COMPARATIVE EXAMPLE 1

The procedure of Example 1 was repeated except that hydrogen plasma treatment was not carried out and samples were produced. The same measurement as in Example 1 was made with respect to obtained samples. The results are shown in FIG. 2.

As is clear from FIG. 2, the degree of photo deterioration varies depending on the existence of hydrogen plasma treatment. That is, the degree of photo deterioration is largest in the case of a sample with no hydrogen plasma treatment. The degree of photo deterioration of a sample with hydrogen plasma treatment at a substrate temperature of room temperature is a little smaller than the sample with no hydrogen plasma treatment. The photo deterioration of a sample with hydrogen plasma treatment at a substrate temperature of 100° C. is remarkably small.

COMPARATIVE EXAMPLE 2

The procedure of Example 3 was repeated except that stroboscopic light was not at all irradiated during the formation of thin film and samples were produced. The same measurement as in Example 3 was made with respect to obtained samples. The results are shown in FIG. 4.

As is clear from FIG. 4, the degree of photo deterioration varies depending on the existence of irradiation of pulse light. That is, the sample of the present invention (Example 3) shows lower electric conductivity at early stage than the sample (Comparative Example 2) to which no pulse light is irradiated during the formation of thin film. However, the degree of photo deterioration of Example 3 is relatively small, and becomes smaller than that of Comparative Example 2 after about an hour.

As is explained hereinbefore, according to the first aspect of the present invention in which amorphous semiconductor thin film is exposed to an atmosphere of hydrogen radical during or after the formation of the thin film, or according to the second aspect of the present invention in which the deposition of film is carried out while irradiating light to the film, amorphous semiconductor having small photo deterioration can be obtained. The semiconductor device using such amorphous semiconductor is stable to light and can be preferably applied to solar cells or thin film transistors.

What is claimed is:

1. An amorphous semiconductor produced by forming on a substrate a thin film of amorphous silicon semiconductor by the decomposition of one of a silane family gas and a mixed gas of silane family gases by at least one of the methods selected from a group consisting of plasma, heat, light, sputtering and reactive sputtering using at least one of silicon and silicone compounds as a target, wherein deposition of the thin film is interrupted periodically and the deposited thin film is exposed to an atmosphere of hydrogen radicals prior to resumption of the deposition of the film.

2. An amorphous semiconductor produced by forming on a substrate a thin film of amorphous silicon semiconductor by the decomposition of one of silane family gases and a mixed gas of silane family gases using a method selected from a group consisting of plasma, heat and light, sputtering and reactive sputtering using at least one of silicon and silicone compounds a target, wherein, after the thin film of amorphous semiconductor has been formed, the film is exposed to an atmosphere containing hydrogen radicals.

3. The semiconductor of claim 1, wherein the amorphous semiconductor is at least one of $a-Si_{1-x-y}Ge_xC_y:H$ (wherein x and y satisfy the relationship of $0 \leq x, y \leq 1$) and $a-Si_{1-x-y}Ge_xC_y:H:F$ (wherein x and y satisfy the relationship of $0 \leq x, y \leq 1$).

4. The semiconductor of claim 2, wherein the amorphous semiconductor is at least one of $a-Si_{1-x-y}Ge_xC_y:H$ (wherein x and y satisfy the relationship of $0 \leq x, y \leq 1$) and $a-Si_{1-x-y}Ge_xC_y:H:F$ (wherein x and y satisfy the relationship of $0 \leq x, y \leq 1$).

5. A semiconductor device comprising an amorphous semiconductor produced by forming on a substrate a thin film of amorphous silicon semiconductor by decomposition of one of silane family gases and a mixed gas of silane family gases using a method selected from a group consisting of plasma, heat, light, sputtering and reactive sputtering using at least one of silicon and silicone compounds as a target, wherein, after the thin film of amorphous semiconductor has been formed, the film is exposed to an atmosphere containing hydrogen radicals.

6. The device of claim 5, wherein the device has a pin structure.

7. The device of claim 5, wherein the device has a Schottky structure.

8. The semiconductor of claim 1, wherein the amorphous semiconductor is at least one of $a-Si_{1-x-y}Ge_xC_y:H$ (wherein x and y satisfy the relationship of $0 \leq x, y \leq 1$) and $a-Si_{1-x-y}Ge_xC_y:H:F$ (wherein x and y satisfy the relationship of $0 \leq x, y \leq 1$).

9. A semiconductor device comprising an amorphous semiconductor produced by forming on a substrate a thin film of amorphous silicon semiconductor by decomposition of one of a silane family gas and a mixed gas of silane family gases by at least one of methods selected from a group consisting of plasma, heat, light, sputtering and reactive sputtering using at least one of silicon and silicone compounds as a target, wherein deposition of the thin film is interrupted periodically and the deposited thin film is exposed to an atmosphere of hydrogen radicals prior to resumption of the deposition of the film.

10. The device of claim 9, wherein the device has a pin structure.

11. The device of claim 9, wherein the device has a Schottky structure.

* * * * *